(12) United States Patent
Rotheroe

(10) Patent No.: US 8,174,829 B1
(45) Date of Patent: May 8, 2012

(54) COOLING ELECTRONIC DEVICES PROVIDED IN ROWS OF RACKS

(75) Inventor: Dave Rotheroe, Austin, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 632 days.

(21) Appl. No.: 12/361,610

(22) Filed: Jan. 29, 2009

(51) Int. Cl.
*H05K 7/20* (2006.01)

(52) U.S. Cl. ........ 361/696; 361/699; 361/695; 361/701; 165/80.4; 454/184

(58) Field of Classification Search .................. None
See application file for complete search history.

(56) References Cited

U.S. PATENT DOCUMENTS

| | | | |
|---|---|---|---|
| 6,374,627 B1* | 4/2002 | Schumacher et al. | 62/259.2 |
| 7,551,971 B2* | 6/2009 | Hillis | 700/90 |
| 7,620,480 B2* | 11/2009 | Patel et al. | 700/276 |
| 7,856,838 B2* | 12/2010 | Hillis et al. | 62/259.2 |
| 2007/0038414 A1* | 2/2007 | Rasmussen et al. | 703/1 |
| 2007/0146994 A1* | 6/2007 | Germagian et al. | 361/695 |
| 2008/0232069 A1 | 9/2008 | Chu et al. | |
| 2008/0259566 A1 | 10/2008 | Fried | |
| 2008/0291626 A1* | 11/2008 | Nelson et al. | 361/696 |
| 2008/0305733 A1 | 12/2008 | Noteboom et al. | |
| 2009/0107652 A1* | 4/2009 | VanGilder et al. | 165/80.2 |
| 2009/0229784 A1* | 9/2009 | Rohr | 165/11.1 |
| 2010/0112925 A1* | 5/2010 | Schmitt et al. | 454/184 |
| 2010/0170277 A1* | 7/2010 | Schmitt et al. | 62/259.2 |
| 2010/0188816 A1* | 7/2010 | Bean et al. | 361/696 |

FOREIGN PATENT DOCUMENTS

WO WO 2008-113044 A2 9/2008

OTHER PUBLICATIONS

"Cold Aisle Containment Reduces Energy Consumption by Eliminating the Mixing of Hot and Cold Air," 42U Cold Aisle Containment, http://www.42u.com/cooling/cold-aisle-containment.htm, pp. 1-2, dated at lest as early as Dec. 21, 2008.

Lars Larsen, "Open Rack Approaches for Maximizing the Efficiency of Equipment in a Cold-Aisle/Hot-Aisle Data Center Environment," Ortronics/Legrand, pp. 1-11, Jun. 2008.

* cited by examiner

*Primary Examiner* — Gregory Thompson

(57) ABSTRACT

To cool racks of electronic devices, the racks are arranged in a plurality of rows to define at least a first aisle and a second aisle, where the second aisle has air cooler than air in the first aisle, and where the fans of the electronic devices cause air to flow from the second aisle to the first aisle. A cooling coil assembly contains a coolant to cool air received from the first aisle, wherein cooled air exits the cooling coil assembly and flows to the second aisle. A temperature of the coolant in the cooling coil assembly is maintained above a dew point of an environment in which the racks are located.

14 Claims, 5 Drawing Sheets

COOLING ELECTRONIC DEVICES PROVIDED IN ROWS OF RACKS

BACKGROUND

Conventional cooling equipment used for cooling electronic devices are relatively inefficient. In some cases, the power consumed by the cooling equipment to cool electronic devices is greater than the power used to operate the electronic devices.

To cool relatively high concentrations of electronic devices, such as computer servers mounted in racks provided in a room, air conditioning units have typically been employed. Such air conditioning units are often located relatively far away from the room in which the racks of computer servers are located. In some arrangements, the server racks are positioned on a raised floor that is above a plenum into which is provided a flow of cold air driven by fans of the air conditioning units. The cold air flows from the plenum through perforated tiles on the raised floor for delivery into the room that houses the server racks. The cooling solution described above is typically inefficient, since the cold air has to be moved relatively large distances between the air conditioning units and the room in which the server racks are located. Moreover, the fans that are used to move the air from the air conditioning units to the server racks can consume relatively large amounts of power.

Alternative cooling solutions have been proposed in which server racks are arranged such that the server racks separate cold aisles from hot aisles. Air in the hot aisles are cooled using cooling equipment, with the cooled air then provided to the cold aisles for delivery to electronic devices located in the server racks. However, the conventional equipment used in such hot aisle/cold aisle solutions also tend to suffer from various inefficiencies.

BRIEF DESCRIPTION OF THE DRAWINGS

Some embodiments of the invention are described, by way of example, with respect to the following figures.

DETAILED DESCRIPTION

Figure 1:
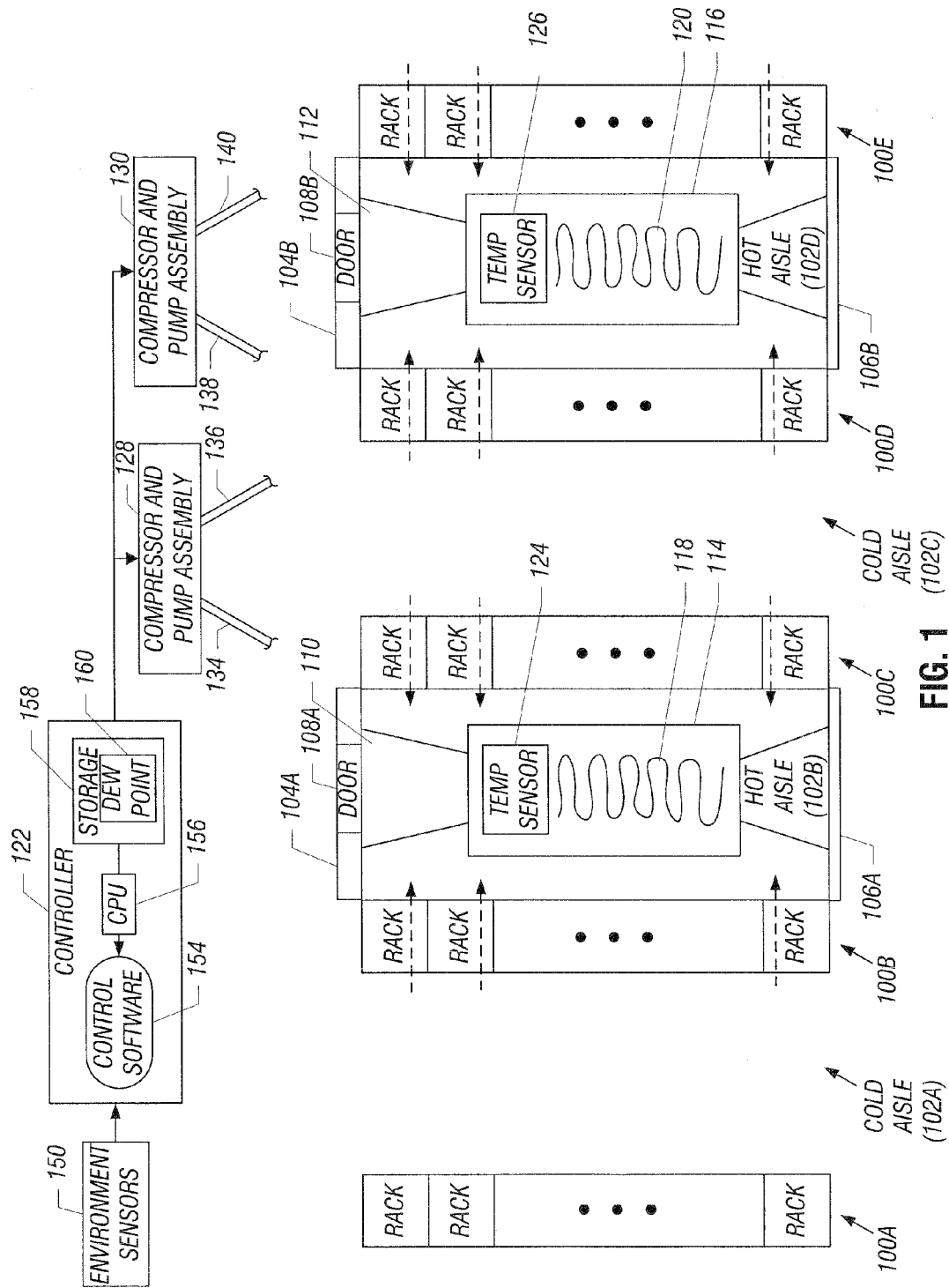
FIG. 1 is a schematic diagram of rows of racks that contain electronic devices, and a cooling system for cooling the electronic devices in accordance with some embodiments.

FIG. 1 schematically illustrates a top view of an exemplary arrangement that includes multiple rows 100A, 100B, 100C, 100D and 100E of racks, where each rack contains electronic devices. A "rack" refers to any containing structure that is capable of receiving multiple electronic devices. In some examples, the racks can be server racks to receive multiple computer servers. In alternative implementations, the electronic devices mounted in the racks can be other types of electronic devices, such as storage devices, communications devices, and so forth.

The multiple rows 100A-100E of racks define multiple aisles 102A, 102B, 102C, and 102D. More specifically, each adjacent pair of rows of racks defines an aisle between the rows in the pair. Thus, the row of racks 100A and the row of racks 100B define an aisle 102A between the rows 100A and 100B. Similarly, the row 100B of racks and the row 100C of racks define the aisle 102B between the rows 100B and 100C; the rows 100C and 100D define the aisle 102C between the rows 100C and 100D; and the rows 100D and 100E define the aisle 102D between the rows 100D and 100E.

In the exemplary arrangement shown in FIG. 1, the aisles 102A and 102C are "cold" aisles, while the aisles 102B and 102D are "hot" aisles. A cold aisle contains air at a temperature that is lower than the air in a hot aisle. In accordance with some embodiments, appropriate sealing mechanisms are provided to reduce the mixing of hot air and cold air in the hot aisles and cold aisles, respectively, to improve efficiency. For example, attachment mechanisms between racks in each row can include sealed gaskets to reduce air leakage through any space between adjacent racks. Moreover, at the ends of each hot aisle 102B, 102D, corresponding sealing panels 104A, 104B and 106A, 106B can be provided to enclose each of the respective hot aisles. To allow for access to the hot aisles, doors 108A, 108B can be provided in the respective sealing panels 104A, 104B. In an alternative embodiment, the sealing panels can be provided at the ends of the cold aisles 102A, 102C instead of the hot aisles, or alternatively, sealing panels can be provided at the ends of both hot aisles and cold aisles.

As depicted by the dashed arrows, air flows from a cold aisle to a hot aisle by passing through electronic devices contained in respective racks. To avoid the use of inefficient external fans, the flow of air from each cold aisle to a corresponding hot aisle is generated by fans contained in the electronic devices themselves. For example, a typical computer server can have one or more fans to draw air from outside the computer server into the enclosure defined by the chassis of the computer server. Such fans of computer servers can be used for causing a flow of air from one side of the computer servers to the other side of the computer servers, with each computer server oriented such that the direction of air flow is from the cold aisle to the hot aisle.

As further depicted in FIG. 1, a roof structure 110 can be provided over the hot aisle 102B, and a roof structure 112 can be provided over the hot aisle 102D. The roof structure 110 has a cooling coil assembly 114, and the roof structure 112 has a cooling coil assembly 116. Each of the cooling coil assemblies 114 and 116 includes one or more cooling coils 118 and 120, respectively. A cooling coil refers to a fluid conduit in which cooled fluid (coolant) is passed. A cooling coil assembly 114 includes a housing or support structure and the cooling coil(s) that is (are) housed or supported by the housing or support structure.

Hot air in the hot aisle 102B or 102D flows through the respective cooling coil assembly 114 or 116, with the hot air passing by the cooling coils 118 or 120 such that the hot air is cooled by the cooling coils. The cooled air that exits each cooling coil assembly 114 or 116 is returned to the respective cold aisle 102A or 102C such that the air can again be drawn through the electronic devices in the respective racks.

In accordance with some embodiments, to reduce the complexity of equipment that has to be provided in the cooling coil assemblies 114 and 116, a controller 122 is provided to control the temperature of the coolant in the cooling coils 118 and 120 such that the coolant's temperature does not rise above the dew point of the environment in which the rows of racks are located. The dew point is the temperature at which the water vapor in the air becomes saturated and condensation begins. By maintaining the coolant's temperature below the dew point, condensation is avoided, such that drip pans and associated fluid outlets do not have to be provided, which can make the design of the cooling coil assemblies 114, 116 more complex and can lead to increased costs of the cooling coil assemblies.

Each of the cooling coil assemblies 114 and 116 has at least one respective temperature sensor 124 and 126. The temperature sensor 124 or 126 is in thermal contact with the respective cooling coil(s) 118 or 120 such that the temperature sensor can be used to monitor the temperature of the coolant that flows within the cooling coil(s) 118 or 120. Alternatively, the temperature sensor 124 or 126 can be thermally coupled to the coolant.

Note that the temperature sensor 124 or 126 can either directly or indirectly provide the temperature of the coolant. More generally, the temperature sensor 124 or 126 outputs a temperature that provides an indication of the temperature of the coolant.

The temperature sensors 124 and 126 are electrically connected to the controller 122, such that the temperature sensors 124 and 126 can output temperature measurements to the controller 122.

The controller 122 is able to control operation of compressor and pump assemblies 128 and 130 that control the flow of coolant to the coils 118 and 120 of the cooling coil assemblies 114 and 116. The compressor and pump assembly 128 pumps coolant through an outlet conduit 134 to the cooling coil assembly 114, and receives coolant through a return conduit 136 from the cooling coil assembly 114. Similarly, the compressor and pump assembly 130 pumps coolant through an outlet conduit 138 to the cooling coil assembly 116, and receives coolant through a return conduit 140 from the cooling coil assembly 116. By controlling the amount of compression of the coolants in the compressor and pump assemblies 128, 130, the temperatures of the coolants in the coils 118, 120 can be controlled such that the temperatures are maintained below the dew point.

The arrangement of FIG. 1 also includes environment sensors 150, which are used to monitor the humidity of the environment in which the racks are located, as well as to measure the barometric pressure. The barometric pressure and humidity information are provided to the controller 122, which uses the barometric pressure and humidity information to determine the dew point of the environment.

As further depicted in FIG. 1, the controller 122 includes control software 154 executable on one or more central processing units (CPUs) 156 connected to a storage 158. The controller 122 can be a computer. The control software 154 is executable to receive environmental measurements (temperature, pressure) from the environment sensors 150. From the environmental measurements, the control software 154 is able to calculate the dew point, which is stored as 160 in the storage 158.

The control software 154 also receives temperature measurements from the temperature sensors 124, 126 in the cooling coil assemblies 114, 116. The temperature measurements from the temperature sensors 124, 126 can be continually received by the control software 154, such that the control software 154 can continually make adjustments if appropriate to maintain the temperature of the coolants in the cooling coil assemblies 114, 116 below the dew point 160. "Continually" receiving the temperature measurements means any one of continuously receiving the temperature measurements, periodically receiving the temperature measurements, intermittently receiving the temperature measurements, or receiving the temperature measurements in response to one or more predefined events (e.g., temperature rising above predefined one or more thresholds).

Figure 2:
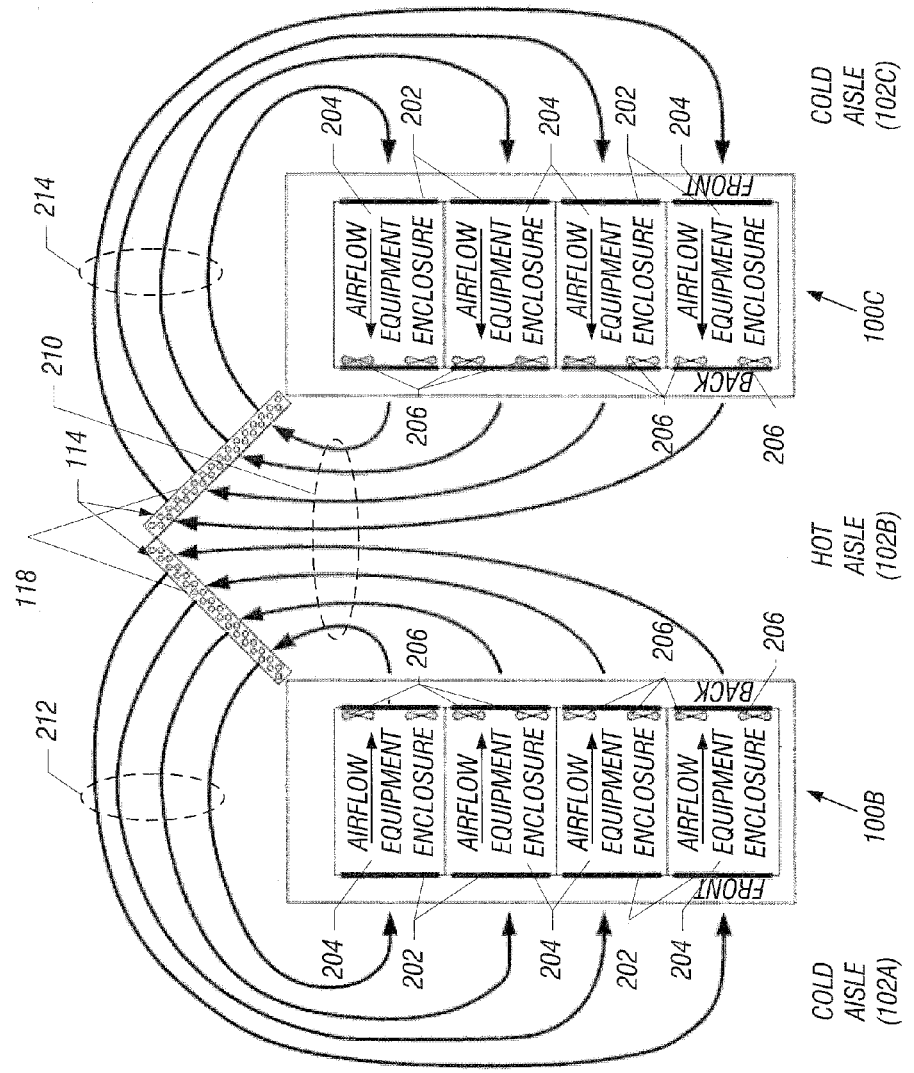
FIGS. 2-4 illustrate cooling solutions according to several embodiments.

FIG. 2 shows a side view of two rows 100B and 100C of racks depicted in FIG. 1. The hot aisle 102B is provided between the two rows 100B and 100C, while the cold aisles 102A and 102C are located on respective opposite sides of the rows 100B and 100C. Electronic devices 202 (e.g., computer servers) of corresponding racks in the rows 100B, 100C are depicted in FIG. 2. Each electronic device 202 has an external housing that defines an equipment enclosure 204, in which components of the electronic device 202 are contained.

The equipment enclosure 204 of each electronic device 202 also contains a respective set of one or more fans 206. When activated, the fans 206 generate air flow through the equipment enclosure 204. In the implementation of FIG. 2, the airflow through each equipment enclosure 204 is from the front of the electronic device to the back of the electronic device. However, in other implementations with different arrangements, the airflow can be from back to front.

The airflows exiting the exhausts of corresponding electronic devices 202 are directed into the hot aisle 102B, and upwardly (as depicted by 210) to the cooling coil assembly 114 that is positioned over the hot aisle 102B. The cooling coil assembly 114 (along with the roof structure 110 of which the cooling coil assembly 114 is part of) is attached to the racks of the rows 100B, 100C in such a way that no hot air escapes from the hot aisle 102B. Instead, the hot air in the hot aisle 102B passes through the cooling coil assembly 114, which causes the air to be cooled by the coils 118.

The cooled air exiting the cooling coil assembly 114 returns to the cold aisles 102A and 102C (arrows 212 and 214, respectively), which are then circulated through the electronic devices 202 in respective rows 100B, 100C.

Figure 3:
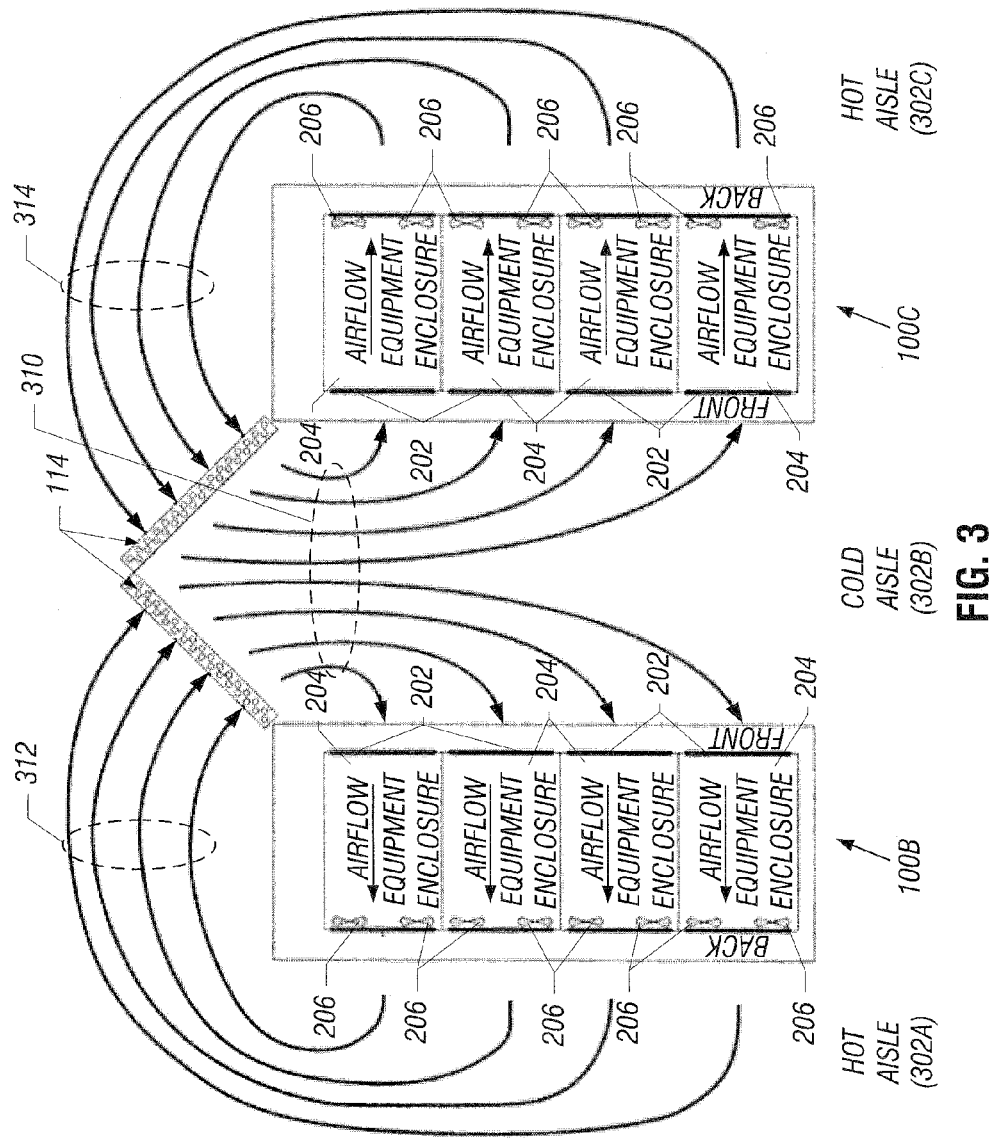

FIG. 3 shows an alternative arrangement, in which the two rows 100B and 100C define a cold aisle 302B between the rows 100B, 100C. Hot aisles 302A and 302C are provided on the two different sides of corresponding rows 100B and 100C.

In the FIG. 3 embodiment, the cooling coil assembly 114 is provided over the cold aisle 302B (instead of hot aisle 102B in FIG. 2). Air drawn by fans 206 in the electronic devices 202 pass through respective equipment enclosures 204 in the direction from cold aisle 302B to hot aisle 302A or 302C. The airflows are output from the exhausts of the electronic devices 202, and are directed along paths 312 and 314 through the hot aisles 302A and 302C, respectively, to the cooling coil assembly 114. The hot air passing through the cooling coil assembly 114 is cooled and exits the cooling coil assembly 114 as cooled air into the cold aisle 302B along paths 310. The cooled air is again drawn through the electronic devices 202 in rows 100B, 100C.

Figure 4:
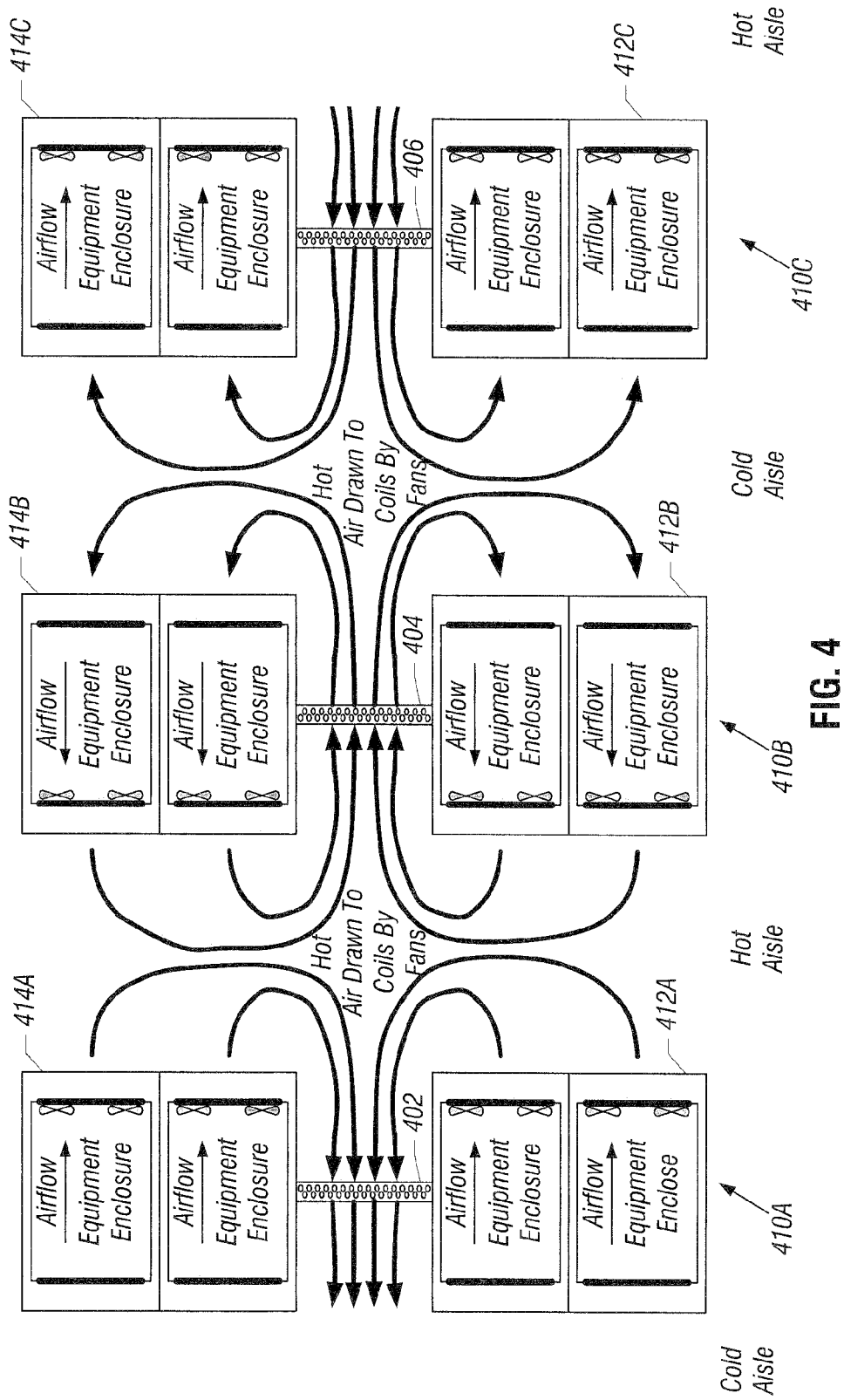

FIG. 4 shows yet another arrangement, in which cooling coil assemblies 402, 404, and 406 are provided between racks in each of the rows 410A, 410B, and 410C, respectively. The cooling coil assembly 402 is positioned between racks 412A and 414A in row 410A, the cooling coil assembly 404 is positioned between racks 412B and 414B in row 410B, and the cooling coil assembly 406 is positioned between racks 412C and 414C in row 410C. In the FIG. 4 embodiment, instead of providing a cooling coil assembly over a hot or cold aisle (as shown in FIG. 2 or 3, respectively), the cooling coil assemblies are provided between racks within a row.

As indicated by the arrows in FIG. 4, the air flows through respective equipment enclosures of the electronic devices and along paths directed (in hot aisles) towards the respective cooling coil assemblies 402, 404, and 406. Cooled air exiting the cooling coil assemblies 402, 404, and 406 is then recirculated along paths in respective cold aisles and through the equipment enclosures. The airflows are generated by the fans of the electronic devices, such that expensive external fans can be omitted in some embodiments. Note that in other embodiments, fans can also be provided in the cooling coil assemblies.

Figure 5:
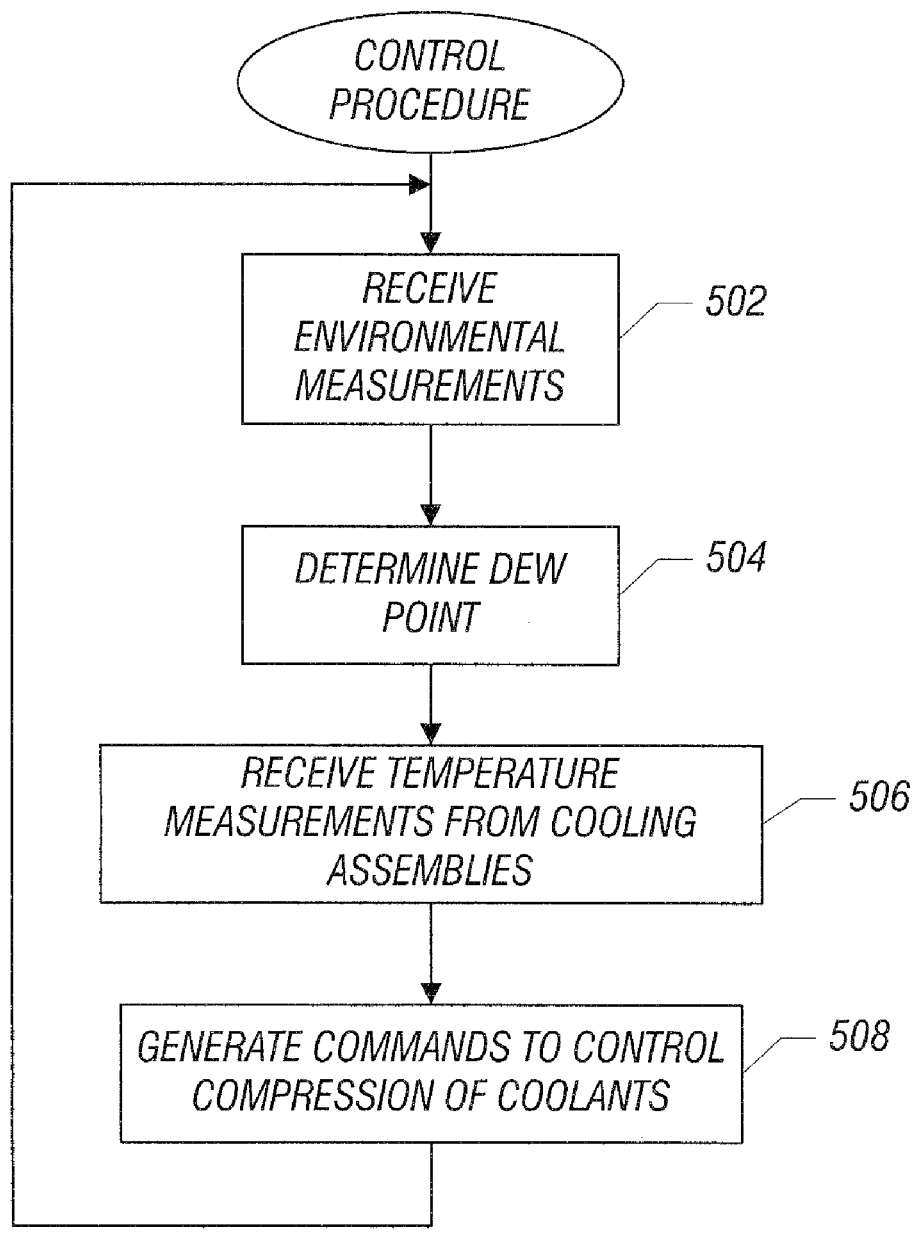
FIG. 5 is a flow diagram of a control procedure performed by a controller according to an embodiment.

FIG. 5 shows a procedure performed by the control software 154 in the controller 122 of FIG. 1. The control software 154 receives (at 502) environmental measurements from the environment sensors 150 (FIG. 1). The environmental measurements include a barometric pressure and humidity of the environment in which racks are located. Based on the received environmental measurements, the control software 154 determines (at 504) the dew point.

The control software 154 further receives (at 506) temperature measurements from cooling coil assemblies (depicted in FIG. 2, 3, or 4). The temperature measurements provide indications of the temperatures of coolants in the cooling coil assemblies. In response to the received temperature measurements, the control software 154 generates (at 508) commands to send to the compressor and pump assemblies 128 and 130 to adjust operations of such assemblies to control compression of coolants in the assemblies 128 and 130. This in effect controls the temperatures of the coolants in the cooling coil assemblies. The coolant temperatures are controlled to be above the dew point determined at 504.

Instructions of software described above (including control software 154 of FIG. 1) are loaded for execution on a processor (such as one or more CPUs 156 in FIG. 1). The processor includes microprocessors, microcontrollers, processor modules or subsystems (including one or more microprocessors or microcontrollers), or other control or computing devices. A "processor" can refer to a single component or to plural components (e.g., one CPU or multiple CPUs).

Data and instructions (of the software) are stored in respective storage devices, which are implemented as one or more computer-readable or computer-usable storage media. The storage media include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; and optical media such as compact disks (CDs) or digital video disks (DVDs). Note that the instructions of the software discussed above can be provided on one computer-readable or computer-usable storage medium, or alternatively, can be provided on multiple computer-readable or computer-usable storage media distributed in a large system having possibly plural nodes. Such computer-readable or computer-usable storage medium or media is (are) considered to be part of an article (or article of manufacture). An article or article of manufacture can refer to any manufactured single component or multiple components.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A system comprising:
   a plurality of rows of racks, wherein the racks contain electronic devices, and the electronic devices comprise respective fans, wherein the plurality of rows of racks define at least a first aisle and second aisle, the second aisle having air cooler than air in the first aisle, and wherein the fans of the electronic devices cause air to flow from the second aisle to the first aisle;
   a cooling coil assembly mounted to receive a flow of air from the first aisle to cool the flow of air, the cooled air to exit the cooling coil assembly to pass to the second aisle; and
   a controller to monitor a temperature of a coolant in the cooling coil assembly and to maintain the temperature of the coolant above a dew point of an environment in which the rows of racks are located.

2. The system of claim 1, further comprising a roof structure over the second aisle, wherein the cooling coil assembly is part of the roof structure.

3. The system of claim 1, further comprising a roof structure over the first aisle, wherein the cooling coil assembly is part of the roof structure.

4. The system of claim 1, wherein the cooling coil assembly is positioned between racks of one of the plurality of rows.

5. The system of claim 4, further comprising another cooling coil assembly positioned between racks of another one of the plurality of rows.

6. The system of claim 1, further comprising a temperature sensor to detect a temperature that indicates the temperature of the coolant, the temperature sensor to output a temperature measurement to the controller.

7. The system of claim 6, further comprising additional sensors to measure barometric pressure and humidity, wherein the controller is to determine the dew point based on the barometric pressure and the humidity.

8. The system of claim 1, wherein the controller is to maintain the temperature of the coolant by controlling compression of the coolant by a compressor and pump assembly.

9. The system of claim 1, wherein the flow of air from the second aisle to the first aisle is produced by the fans of the electronic devices without using additional fans.

10. The system of claim 1, wherein the plurality of rows define additional first and second aisles, wherein air in each of the second aisles is cooler than air in each of the first aisles, and wherein the electronic devices in the plurality of rows cause air to flow through corresponding electronic devices from the second aisles to the first aisles.

11. The system of claim 1, wherein the electronic devices are computers.

12. A method of cooling racks of electronic devices, comprising:
   arranging the racks in a plurality of rows to define at least a first aisle and a second aisle, the second aisle having air cooler than air in the first aisle, and wherein fans of the electronic devices cause air to flow from the second aisle to the first aisle; and
   providing a cooling coil assembly containing a coolant to cool air received from the first aisle, wherein cooled air exits the cooling coil assembly and flows to the second aisle; and
   maintaining a temperature of the coolant in the cooling coil assembly above a dew point of an environment in which the racks are located.

13. The method of claim 12, further comprising:
   receiving a temperature measurement from a temperature sensor associated with the cooling coil assembly, wherein the temperature measurement provides an indication of the temperature of the coolant.

14. The system of claim 13, further comprising:
   receiving measurements of barometric pressure and humidity; and
   determining the dew point based on the barometric pressure and the humidity.

* * * * *

UNITED STATES PATENT AND TRADEMARK OFFICE
CERTIFICATE OF CORRECTION

| | |
|---|---|
| PATENT NO. | : 8,174,829 B1 |
| APPLICATION NO. | : 12/361610 |
| DATED | : May 8, 2012 |
| INVENTOR(S) | : Dave Rotheroe |

It is certified that error appears in the above-identified patent and that said Letters Patent is hereby corrected as shown below:

In column 6, line 61, in Claim 14, delete "system" and insert -- method --, therefor.

Signed and Sealed this
Fourth Day of December, 2012

David J. Kappos
*Director of the United States Patent and Trademark Office*